(12) United States Patent
Choi

(10) Patent No.: US 6,204,530 B1
(45) Date of Patent: Mar. 20, 2001

(54) FLASH-TYPE NONVOLATILE SEMICONDUCTOR MEMORY DEVICES FOR PREVENTING OVERERASURE

(75) Inventor: Jeong-Hyuk Choi, Suwon (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 09/374,545

(22) Filed: Aug. 13, 1999

(30) Foreign Application Priority Data

Aug. 13, 1998 (KR) .................................................. 98-32859

(51) Int. Cl.⁷ ................................................. H01L 29/788
(52) U.S. Cl. .......................... 257/315; 257/316; 257/317; 257/321
(58) Field of Search ..................................... 257/315–317, 257/319, 321

(56) References Cited

U.S. PATENT DOCUMENTS

| | | | |
|---|---|---|---|
| 5,273,926 | * 12/1993 | Tigelaar | 438/261 |
| 5,278,439 | * 1/1994 | Ma et al. | 257/319 |
| 5,427,968 | * 6/1995 | Hong | 438/264 |
| 5,670,809 | 9/1997 | Saitoh | 257/316 |
| 5,714,412 | * 2/1998 | Liang et al. | 438/266 |
| 5,929,480 | * 7/1999 | Hisamune | 257/320 |
| 6,097,059 | * 8/2000 | Yamada | 257/321 |

OTHER PUBLICATIONS

K. S. Kim et al., "A Novel Dual String NOR (DuSOR) Memory Cell Technology Scalable to The 256 Mbit and 1Gbit Flash Memories", 1995 IEEE, pp. 11.1.1 to 11.1.4.

* cited by examiner

Primary Examiner—Steven Loke
Assistant Examiner—Thien F Tran
(74) Attorney, Agent, or Firm—Marger Johnson & McCollom, P.C.

(57) ABSTRACT

A nonvolatile semiconductor memory device includes a p-type semiconductor substrate having a surface region, and bit lines formed as n-type first diffusion regions in the surface region, extending in a column direction. The bit lines define between them a plurality of separated, parallel channel regions, extending in a row direction. A plurality of conductive floating gates are formed over first portions of respective channel regions on a first insulating layer, and extend over portions of the first diffusion regions. A plurality of conductive control gates is formed to extend over the floating gates, and over second portions of the channel regions that are not covered by the floating gates. The control gates are separated from the floating gates and from the second portions by additional insulating layers. A common source line is formed by an elongated conductor extending in the column direction, over the control gates and insulated from them. A plurality of n-type second diffusion layers are formed in the surface region between successive second portions of the channel regions and connected to the common source line. These define an intermittent source line under the control gate layers. At the points of interruption, the second diffusion layers form selection transistors with the control gates, which are turned on or off depending on whether the corresponding cell is being read. When read, they prevent reading out any error data if the memory cell had been over-erased.

17 Claims, 9 Drawing Sheets

FLASH-TYPE NONVOLATILE SEMICONDUCTOR MEMORY DEVICES FOR PREVENTING OVERERASURE

BACKGROUND OF THE INVENTION

1. Field of the Invention

The present invention relates to nonvolatile semiconductor memory devices, and more particularly to flash-type electrically erasable programmable read only memory (EEPROM) devices with overerasure preventing structures.

2. Description of the Related Art

A nonvolatile semiconductor memory is a type of memory that retains stored data when a power source is removed. There are various types of nonvolatile semiconductor memories, such as read only memories (ROMs), programmable read only memories (PROMs), erasable programmable read only memories (EPROMs), and electrically erasable programmable read only memories (EEPROMs).

EPROMs are erased by ultra-violet light, which in general takes a long time. However, flash EEPROMs are erased much more quickly, and thus are widely used in data processing systems requiring reprogrammable nonvolatile semiconductor memories.

Flash EEPROMs generally include an array of transistor memory cells, each having a floating gate and a control gate thereon. During erasure, as with EEPROMs, entire sets of memory cells of the flash EEPROM are erased. A flash EEPROM often includes a plurality of sectors (or blocks) into which the memory cell array is divided, and all memory cells in the selected sector are erased simultaneously. Once the flash EEPROM is bulk erased, selected memory cells are programmed.

To enhance capacity of memory cells and speed of the flash EEPROM, there have been developed technologies of memory cell arrays with NOR-type and NAND-type. In the NOR-type memory cell array, drains and sources of floating gate cell transistors are connected in parallel between neighboring bit (or drain) and source lines. In the NAND-type memory cell array, a plurality of series-connected floating gate cell transistors are connected between corresponding bit and source lines. However, even though the NAND-type memory cell array exhibits increased capacity of memory cells, it has a slower access speed, because of the small cell current, as compared to the NOR-type memory cell array (herein referred to as a NOR-type flash EEPROM). On the other hand, the NOR-type flash EEPROM exhibits advantages such as high speed and random access. The NOR-type flash EEPROM is disclosed in an article entitled "A Novel Dual String NOR (DuSNOR) Memory Cell Technology Scalable to the 256 Mbit and 1 Gbit Flash Memories", by K. S. Kim et al., IEDM 1995, pages 263–266.

A conventional NOR-type flash EEPROM is of a virtual ground type. FIG. 1 is a schematic plan view of a portion of a virtual ground type flash EEPROM memory cell array according to a prior art, and FIG. 2 is a cross-sectional view taken along a line 2–2' of FIG. 1. FIG. 3 is an equivalent circuit diagram of the memory cell array shown in FIG. 1.

Referring to FIGS. 1 and 2, heavily doped $n^+$ diffusion regions 14, 16 and 18 are respectively buried beneath spaced apart and parallel ones of thick field oxide strips 12 on a p-type semiconductor substrate 10. A thin oxide (or dielectric) layer 20 is formed on a surface of substrate 10 between two neighboring field oxide strips 12. Floating gates 22 of polycrystalline silicon are formed on oxide layers 20. Floating gates 22 extend beyond oxide layers 20 so as to cover portions of field oxide strips 12. Insulating layers 24 are formed on floating gates 22. An elongate control gate layer 26 of conductive material, extending perpendicularly to field oxide strips 12, is formed on insulating layers 24. Seen also in FIG. 1, parallel elongated control gate layers 26 and 28 are word lines WL1 and WL2, respectively.

Returning to FIG. 2, an elongated diffusion region 16 is a common source line CSL, and the elongated diffusion regions 14 and 18 are bit lines BL1 and BL2, respectively. Channel regions 30 are disposed between two neighboring diffusion regions, underlying floating gates 22.

Referring also to FIG. 3, erase, program and read-out operations of memory cells are now described.

To erase all the shown memory cells M11~M22, a high voltage of about 12 V is applied to the common source line CSL, with the word lines WL1 and WL2 grounded and the bit lines BL1 and BL2 floated. Electrons are then transported from floating gates 22 to source regions, i.e. common source line CSL, by Fowler-Nordheim tunneling, thereby causing threshold voltages of memory cell transistors to become about 2 V. The erasure of memory cells M11~M22 can alternately be performed by applying a potential of about 18 V to substrate 10, with the word lines WL1 and WL2 grounded.

To program a specific memory cell M11, a high voltage of about 12 V is applied to the word line WL1 with the common source line CSL grounded, while a voltage of about 6 V are applied to bit line BL1. On the other hand, the word line WL2 and bit line BL2 are grounded, so as not to program the other three cells. Hot electrons generated at channel region 30 of memory cell M11 are then injected into its floating gate 22, thereby causing a threshold voltage of the memory cell M11 to become about 7 V.

To read out data stored in the memory cell M11, a voltage of about 1 V is applied to the bit line BL1, with common source line CSL grounded, and a voltage of about 5 V is applied to the word line WL1. If a memory cell M11 is programmed, its threshold voltage is about 7 V, and thus it functions as an off-transistor. On the other hand, if memory cell M11 is erased, then it functions as an on-transistor, with electrical current flowing on the bit line BL1. A sense amplifier (not shown) connected to the end of bit line BL1 detects the flowing electrical current, and thereby data stored in the memory cell M11 is accordingly determined.

As such, a memory cell, i.e. a floating gate transistor, normally functions like an enhancement mode transistor. However, a problem in the prior art is that a memory cell can have a negative threshold voltage, and thereby functions like a depletion mode transistor. A memory cell with such a negative threshold voltage after erasure is referred to as an over-erased memory cell. Such can be produced by variations or discrepancies in process and erase timing, or an increase of erase cycles. When the memory cell operates in depletion mode, it stays at a conductive state, even when not selected, and may prevent the cells on the same bit line from being read correctly. For example, suppose that the memory cell M22 is in the over-erased state. Then, when data is read-out from a selected one of other memory cells in the same column as the memory cell M22, error data may be read-out since the memory cell M22 is in a conductive state. Thus, a single over-erased memory cell can lead to failure of the entire memory.

A technique for solving the above-mentioned problem is to use an array of split-type flash EEPROM cells, as disclosed in U.S. Pat. No. 5,670,809. The array includes a plurality of n+ buried diffusion layers, i.e. drain/source regions, formed in a p-type semiconductor substrate to extend in parallel to one another in a column direction. Two neighboring ones of the diffusion layers define between them a plurality of channel regions spaced apart in the column direction and extending in the row direction. A plurality of floating gates are arranged in a matrix form of rows and columns so as to be placed over portions of the drain regions and the channel regions respectively interposing thick and thin insulating layers.

A plurality of control gate strips, i.e. word lines, extend in the row direction over the floating gates through an insulating layer, over the portion of the channel regions not covered by the floating gates through a split gate insulating layer, and over the source regions through a thick insulating layer. Thus, each of the split-type flash EEPROM cells has a structure in which a floating gate transistor and a split gate transistor are connected in series between drain and source regions.

Accordingly, even though a floating gate transistor could operate in a depletion mode due to over-erasure, there will still be no current flowing between the drain and source regions in a read-out operation. Thus is because the split gate transistor operates in an enhancement mode when the series-connected floating gate transistor is not selected, i.e. when 0 V is applied to its control gate. Thus, the split gate type cell eliminates the problem arising from over-erasure. However, the split gate arrangement requires a larger cell size, thereby limiting the number of flash EEPROM cells in a flash EEPROM cell array with a given area.

SUMMARY OF THE INVENTION

An object of the present invention is to provide a nonvolatile semiconductor memory device including an array of memory cells capable of preventing reading of error data due to an over-erased memory cell without increasing the cell size.

Another object of the present invention is to provide a nonvolatile semiconductor memory device capable of increasing densities of memory cells.

To achieve the above objects, there is provided a nonvolatile semiconductor memory device including a p-type semiconductor substrate having a surface region, and bit lines formed as n-type first diffusion regions in the surface region, extending in a column direction. The first diffusion regions define between them a plurality of channel regions in the surface region, separated from one another and extending in a row direction generally perpendicular to the column direction.

A plurality of floating gate layers of conductive material are formed over first portions of respective channel regions on a first insulating layer, and extend over portions of the first diffusion regions. A plurality of control gate layers of conductive material are formed to extend over the floating gate layers and over second portions of the channel regions that are not covered by the floating gate layers. The control gate layers are separated from the floating gate layers and from the second portions by additional insulating layers.

A common source line is formed by an elongated conductive layer that extends in the column direction, and is insulated from the control gate layers. Unlike with the prior art, however, the common source line is disposed over the control gate layers.

A plurality of n-type second diffusion layers are formed in the surface region, between successive second portions of the channel regions. These second diffusion layers define an intermittent source line under the control gate layers. The second diffusion layers are connected to the common source line.

At the points of interruption of the intermittent source line, the second diffusion layers form selection transistors with the control gate layers. The selection transistors are advantageously designed such that they are turned on or off depending on whether the corresponding memory cell is being read. When it is not being read, the corresponding selection transistor prevents reading out any data that could be erroneous if the memory cell had been over-erased.

BRIEF DESCRIPTION OF THE DRAWINGS

These and various other features and advantages of the present invention will be readily understood with reference to the following detailed description taken in conjunction with the accompanying drawings, in which.

DETAILED DESCRIPTION OF THE PREFERRED EMBODIMENTS

Figure 1:
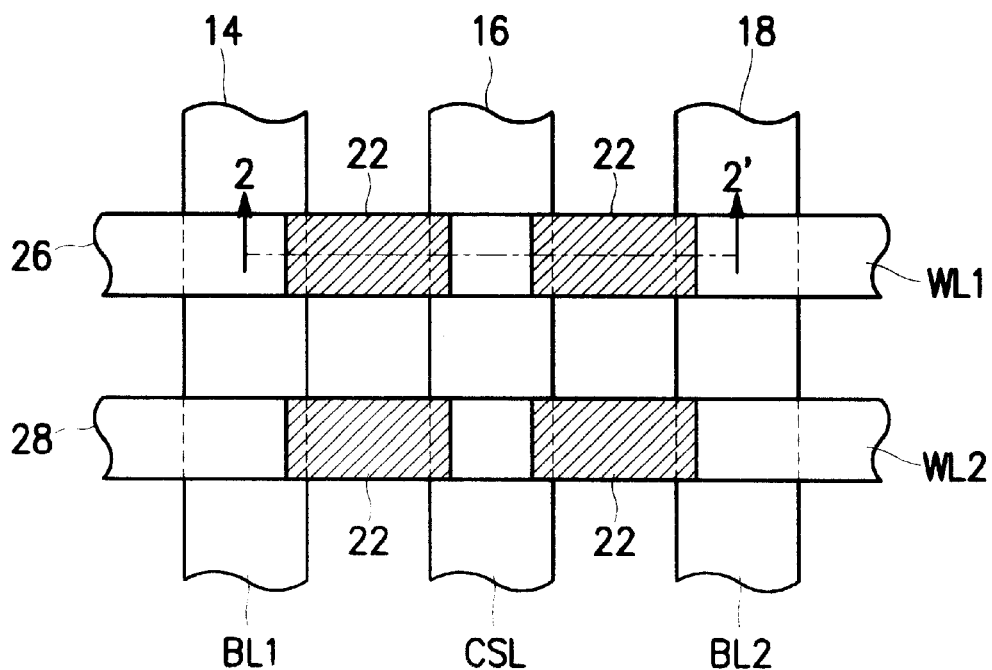
FIG. 1 illustrates an enlarged plan view of a portion of a virtual ground type flash EEPROM memory cell array according to the prior art.
Figure 2:
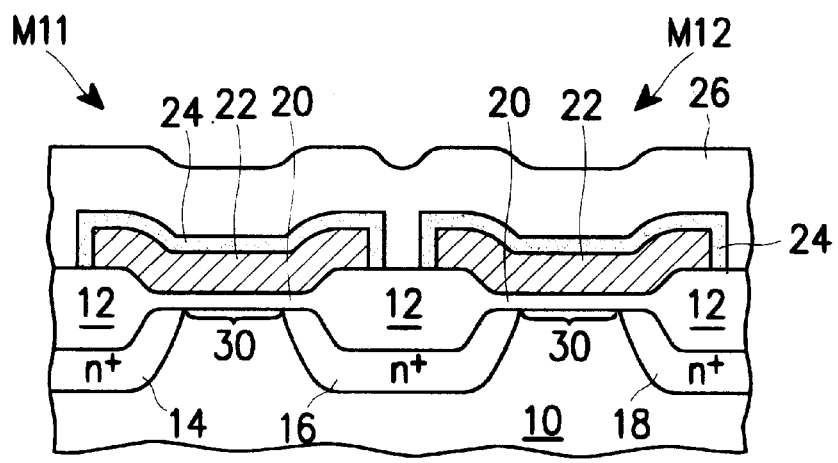
FIG. 2 illustrates a cross-sectional view taken along a line 2–2' shown in FIG. 1.
Figure 3:
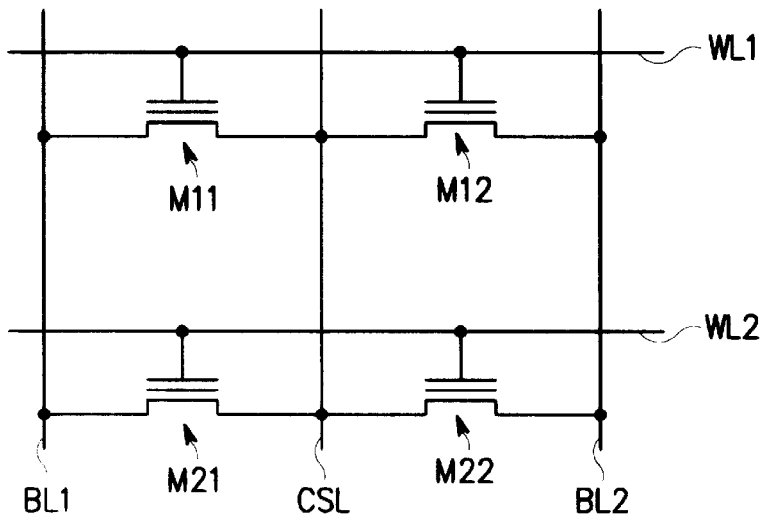
FIG. 3 illustrates a schematic equivalent circuit diagram of the device of FIG. 1.

Preferred embodiments of the present invention will be described with reference to FIGS. 4 to 14. It should be noticed that in the drawings, like reference number or symbol represents like element or part.

Figure 4:
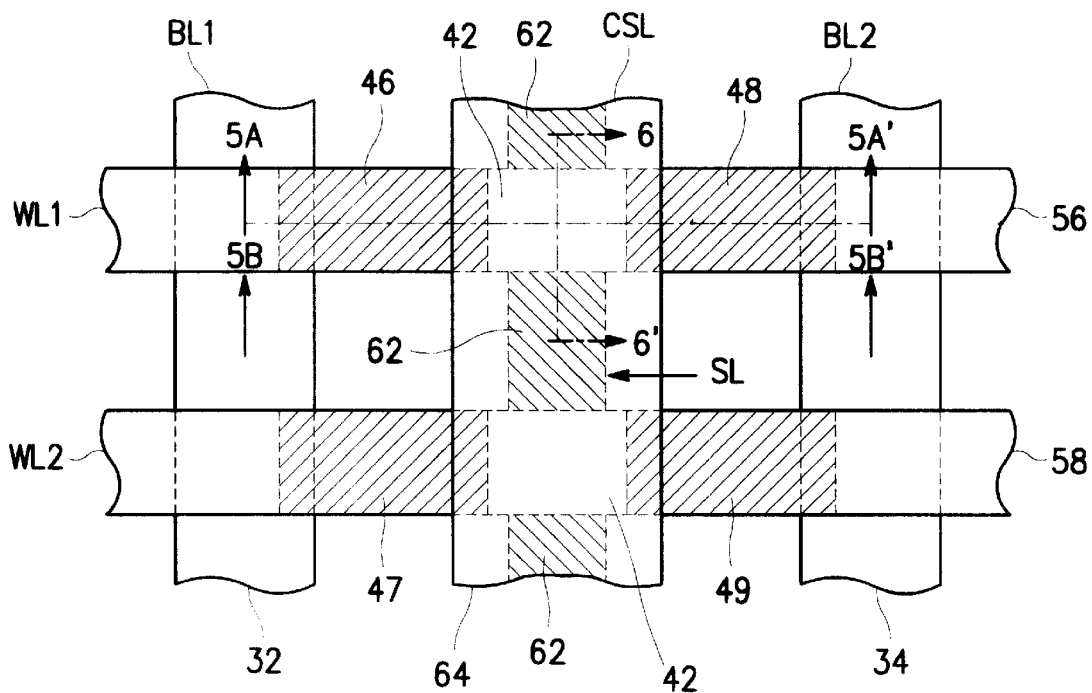
FIG. 4 illustrates an enlarged plan view of a portion of a flash EEPROM memory cell array according to one embodiment of the present invention.
Figure 5A:
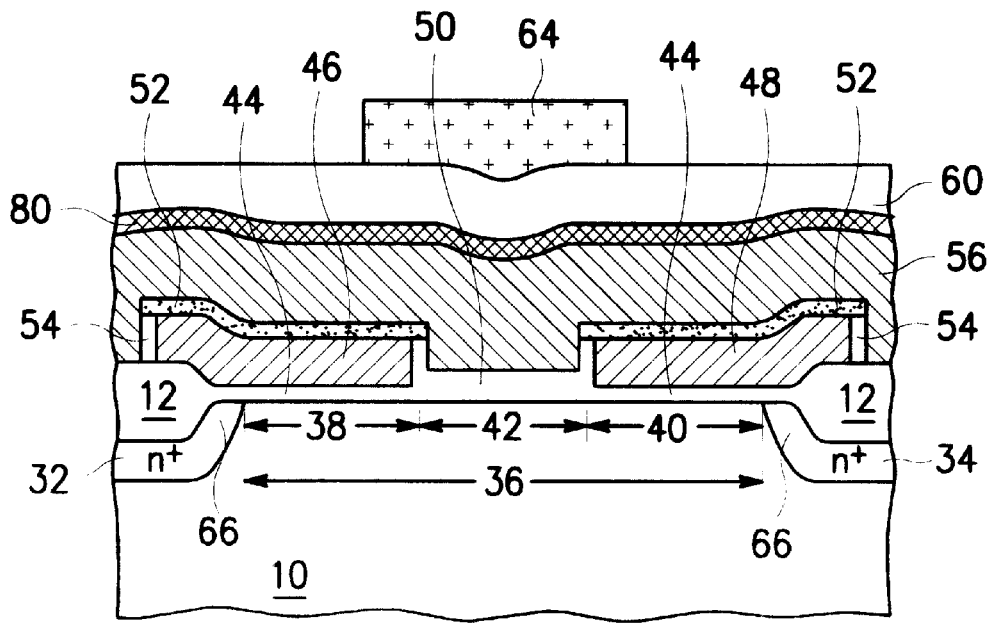
FIG. 5A illustrates a cross-sectional view taken along a line 5A–5A' shown in FIG. 4.
Figure 5B:
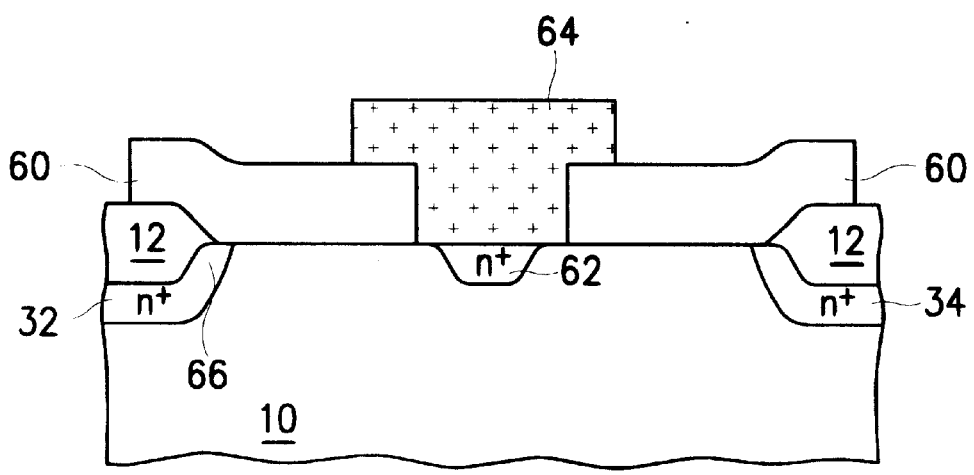
FIG. 5B illustrates a cross-sectional view taken along a line 5B–5B' shown in FIG. 4.
Figure 6:
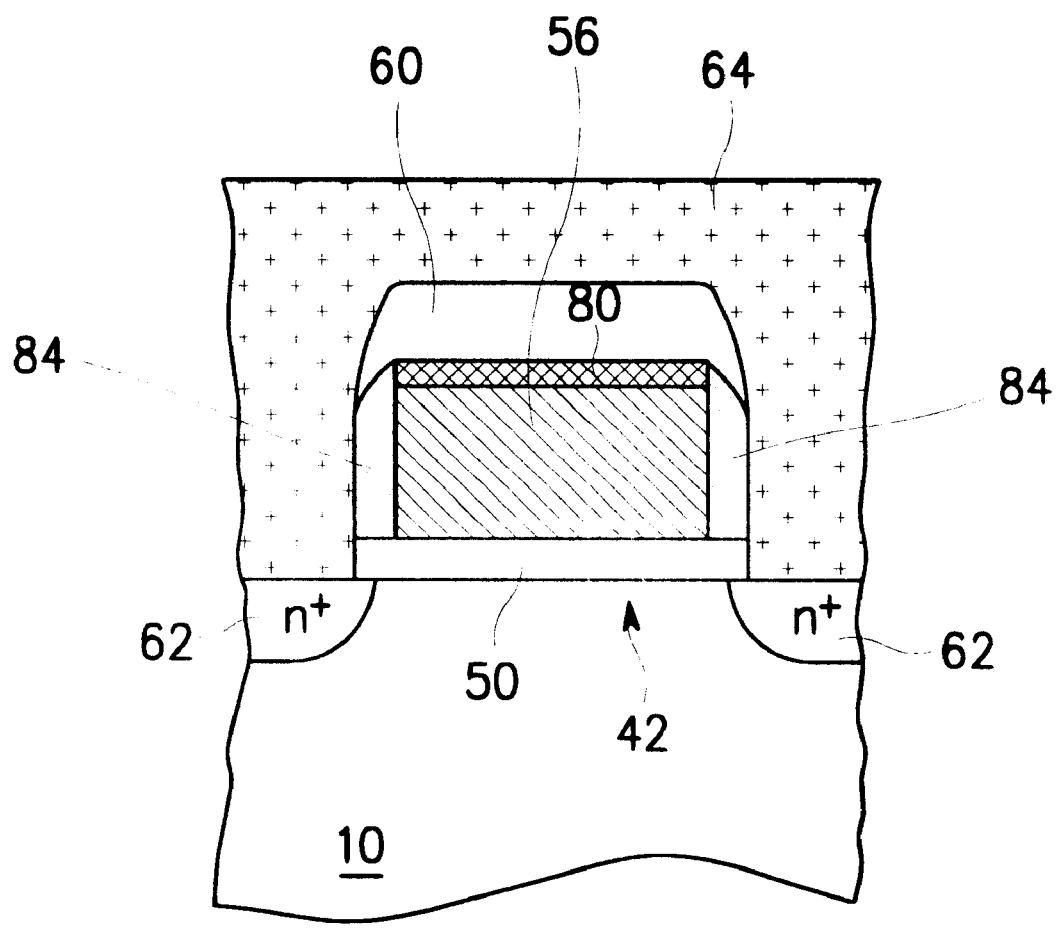
FIG. 6 illustrates a cross-sectional view taken along a line 6–6' shown in FIGS. 4 and 13.
Figure 7:
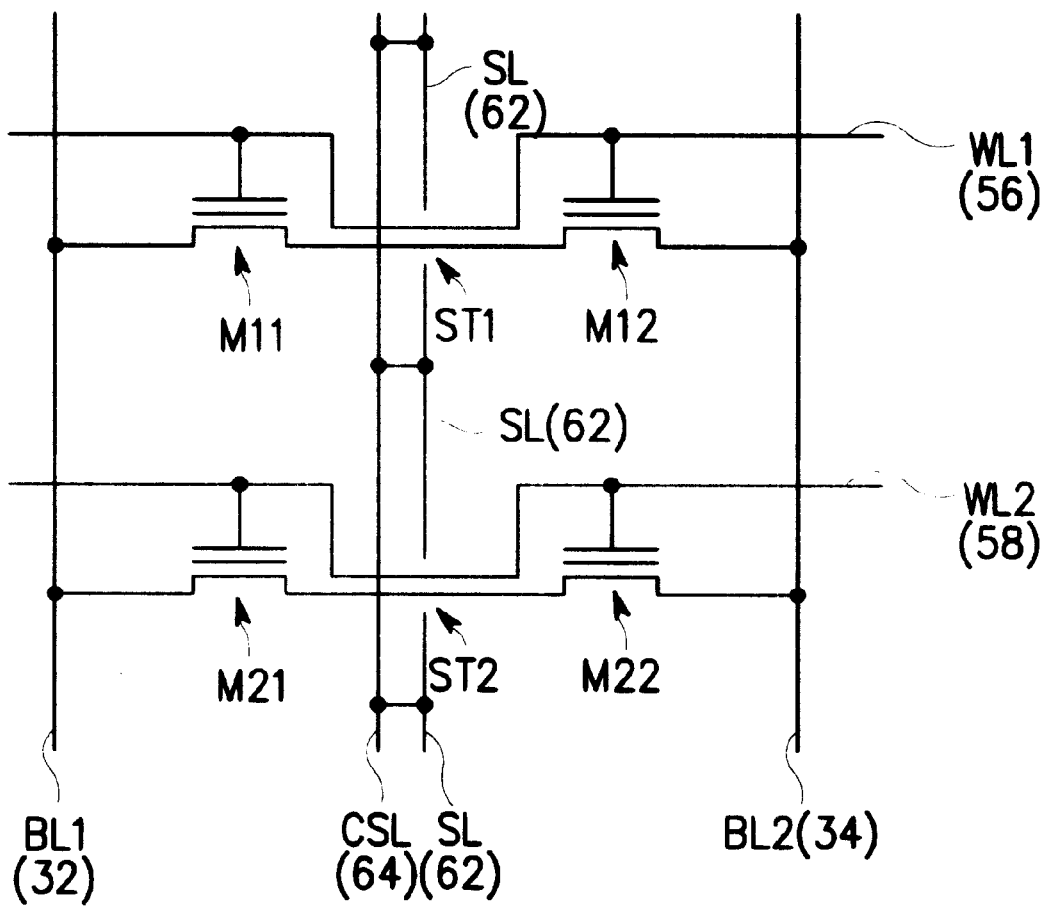
FIG. 7 illustrates a schematic equivalent circuit diagram of the device of FIG. 4.

FIG. 4 shows an enlarged plan view of a portion of an array of flash EEPROM memory cells according to one embodiment of the present invention. For the convenience of explanation, although four memory cells are illustrated, it is obvious to those skilled in the art that a multiplicity of memory cells are arranged in a matrix form of rows and columns on a semiconductor substrate. FIGS. 5A, 5B and 6 show enlarged cross-sectional views taken along lines 5A–5A', 5B–5B' and 6–6' in FIG. 4, respectively. FIG. 7 shows a schematic equivalent circuit diagram of FIG. 4.

Referring to FIGS. 4 through 6, a substrate 10 may be a p-well on a surface of an n-type semiconductor substrate, a p-well in an n-well on a surface of a p-type semiconductor substrate, or an appropriate region in a semiconductor substrate. As a person skilled in the art will appreciate, the conductivities of the various structures are interchangeable.

First elongated diffusion regions, i.e. heavily doped $n^+$ buried diffusion regions 32 and 34, are spaced apart in parallel in a surface region of a p-type semiconductor substrate 10, and extend in a first (or column) direction, which is upright in FIG. 4 and perpendicular to the drawing of FIGS. 5A and 5B. Diffusion regions 32 and 34 define between them channel regions 36, which are spaced apart in parallel to one another extending in a row direction, i.e. a second direction generally perpendicular to the first direction. Seen best in FIG. 5A, each of channel regions 36 consists of first channel regions 38 and 40, and a second channel region 42 therebetween.

Elongated, parallel, spaced-apart field oxide layers 12 overlying the diffusion regions 32 and 34 extend in the first direction. A thin oxide layer 44, sometimes also known as first insulating layer, such as a silicon oxide layer of about 100 Å is on first channel regions 38 and 40.

Floating gate layers 46 and 48 of conductive material, such as polycrystalline silicon, are disposed on layer 44, over regions 38, 40, and also overlying side portions of field oxide layers 12. The first diffusion regions 32 and 34 may extend below oxide layer 44 contiguous to opposite edges of the field oxide layers 12.

A gate oxide layer 50, also known as third insulating layer, such as a silicon oxide layer with a thickness of about 200 Å, is formed on second channel regions 42. An interlevel insulating layer 52, also known as second insulating layer, is formed on the floating gate layers 46 and 48. A side wall insulating layer 54 is formed on side wall surfaces of the floating gate layers. As seen also in FIG. 4, elongated control gate layers 56, 58 of conductive material extend in the second direction, so as to be parallel to one another and spaced apart. They are disposed over floating gate layers 46 and 48, the portion of second channel regions 42 that is not covered by layers 46 and 48, and field oxide layer 12.

As shown in FIG. 6, an insulating layer 60 is formed on upper and side-wall surfaces of control gate layers 56 and 58, and also on side-wall surfaces of floating gate layers 46 and 48 opposite in the first direction.

An important part of the invention is the existence of second diffusion regions, i.e. $n^+$ buried diffusion regions 62. These are formed between neighboring second channel regions 42, and extend arranged alternatively in the first direction between neighboring second channel regions 42. They are portions of an intermittent source line SL. All such portions are connected to a common source line CSL 64 which is located elsewhere, as will be seen below. However, since the aggregate of regions 62 form only an intermittent source line, they do not function exactly as a source line.

The special arrangement of second diffusion regions 62, as an intermittent source line, gives rise to special selection transistor structures at the point of the periodic interruption. The selection transistors function as is described below.

Referring to FIG. 7, first diffusion regions 32 and 34 provide bit lines BL1 and BL2, serving as drain regions of four floating gate memory cells M11 to M22. Control gate layer 56 provides word line WL1 serving as a gate electrode of a selection transistor ST1 connected between memory cells M11 and M12. In a similar manner, control gate layer 58 provides the word line WL2, serving as a gate electrode of a selection transistor ST2 connected between memory cells M21 and M22.

The second diffusion regions 62 provide intermittent source lines SL, serving as drain/source regions of the selection transistor ST1 and ST2. The source lines SL are connected to a common source line CSL (which, referring to FIGS. 4–6 is made from conductive layer 64). Opposite ones of the second diffusion regions 62 also function as source regions of neighboring memory cells M11 and M12, and M21 and M22 through second channel regions 42. Thus, the second diffusion regions 62 are neighboring to the first channel regions 38 and 40 underlying floating gate layers 46 and 48, thereby enhancing the density of memory cells.

Referring to FIGS. 4 to 7, erase, program and read operation will be described.

To erase memory cells M11 to M22, an erase voltage of about 12 V is applied to bit lines BL1 and BL2, with word lines WL1 and WL2 grounded and the common source line CSL floated. Electrons are then tunneled from floating gates 46 and 48 to first diffusion regions 32 and 34, i.e. drain regions, through tunnel portions of insulating layer 44, thereby causing threshold voltages of the memory cells to be about 2 V.

Erasure of the memory cells can alternately be performed by applying about 18 V to substrate 10, with word lines WL1 and WL2 grounded and bit lines BL1 and BL2 and the common source line CSL floated. If a high voltage, such as about 12 V, is intended to be applied to bit lines BL1 and BL2, then first diffusion regions 32 and 34 may be graded diffusion regions, such as $n^+/n^-$, in order to prevent the junction breakdown of drain regions.

To program a memory cell M11, a potential of about 12 V is applied to word line WL1, and one of about 6 V to the selected bit line BL1, with the common source line CSL grounded. The unselected word line WL2 is grounded. Hot electrons are then generated at the first channel regions of the memory cell M11, and are injected into its floating gate 46. As a result, the threshold voltage of the memory cell M11 becomes about 7 V.

To read data from memory cell M11, a potential of about 5 V is applied to the selected word line WL1, and one of about 1 V to bit line BL1, with common source line CSL grounded and bit line BL2 floated. The unselected word line WL2 is grounded. The selection transistor ST1 is also turned on, because of the 5 V potential applied to word line WL1. Thus, if memory cell M11 is in a programmed state, there is no current flowing on the bit line BL1, because it serves as an off-cell. However, if the memory cell M11 is in an erased state, there is current flowing on the bit line BL1 because it serves as an on-cell.

It is now assumed, for example, that the memory cell M21 is over-erased when the memory cell is read. Selection transistor ST2 is then turned off, i.e. stays in a non-conductive state, because unselected word line WL2 is grounded. Thus, there is no current flowing between drain and source of the over-erased memory cell M21. As a result, data of the other memory cells may be read-out correctly, irrespectively of the fact that there is an over-erased memory cell in the same column. This solves the prior art problem.

Referring now to FIGS. 8 to 12, a method of manufacturing the flash EEPROM cells shown in FIG. 5A is described.

Figure 8:
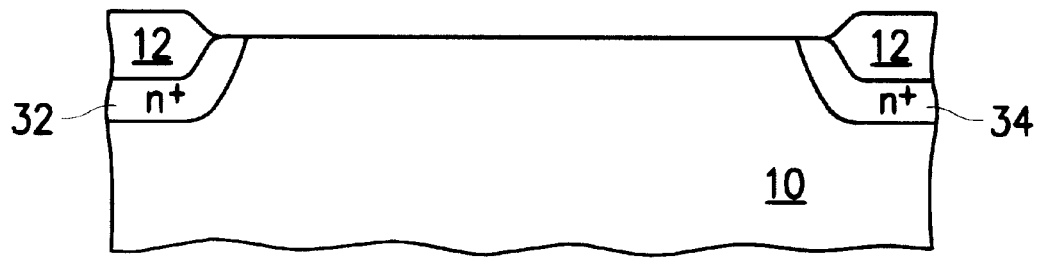
FIGS. 8 to 12 illustrate sequential steps manufacturing the structure shown in FIG. 5A.

Referring to FIG. 8, semiconductor substrate 10 may be a p-type monocrystalline silicon substrate, a p-type well formed on one surface of an n-type monocrystalline silicon substrate, a p-type well surrounded by an n-type well formed on one surface of a p-type monocrystalline silicon substrate, or a p-type well in a p-type epitaxial layer formed on one surface of a p-type monocrystalline silicon substrate, as mentioned above. A pad oxide layer of about 200 Å and a silicon nitride layer in the range of 1,500~2,000 Å are sequentially formed on a surface region of the substrate 10.

A masking layer (not shown), such as a photoresist, is then formed on the silicon nitride layer in order to define the n+ buried diffusion regions, i.e. first diffusion regions 32 and 34, and the field oxide layer 12 thereon. After etching of the exposed silicon nitride layer, exposed portions of substrate 10 are subjected to arsenic ion-implantation at a dose of about $1\sim5\times10^{15}$ ions/cm$^2$ with an energy of about 60 keV. As mentioned above, to form the graded diffusion regions, i.e. n+/n− graded drain regions, phosphorous ion-implantation is performed at a dose of $0.2\sim0.8\times10^{15}$ ions/cm$^2$ with an appropriate energy after the arsenic ion-implantation. Then the masking layer is removed.

Subsequently, a field oxide layer with a thickness of about 3,500 Å is formed in an atmosphere of wet $O_2$ at a temperature of 800° C.~900° C. The silicon nitride layer and the pad oxide layer is then removed, and a sacrificial oxide layer is formed and removed. As a result, as shown in FIG. 8, field oxide layer 12, n+ (or graded n+/n−) buried drain diffusion regions, i.e. first diffusion regions 32 and 34 are formed. Relatively deeper and more graded drain regions is a result due to rapid diffusion properties of phosphorous in silicon.

Figure 9:
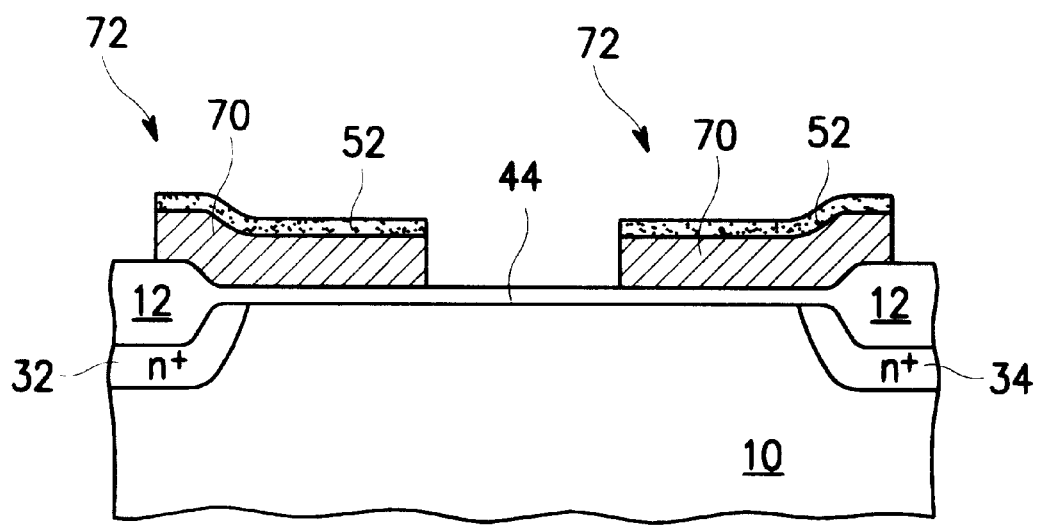

Referring, then, to FIG. 9, the exposed surface region is then subjected to boron or $BF_2$ ion-implantation at a dose of about $2\times10^{13}$ ions/cm$^2$ with an energy of about 40 keV, which controls the threshold voltage of the eventual selection transistor. After the ion-implantation, a tunnel oxide layer, i.e. thin insulating layer 44, with a thickness of about 100 Å, is thermally grown on the exposed surface region. Polycrystalline silicon layer with a thickness of about 1,500 Å is deposited on the substrate by a conventional chemical vapor deposition (CVD) technique, and an interlevel insulating layer is deposited on the surface of the polycrystalline silicon layer. The interlevel insulating layer may be an ONO layer with a $SiO_2$ layer of about 80 Å, a $Si_3N_4$ layer of about 100 Å, and a $SiO_2$ layer of about 40 Å.

A masking pattern is then formed on the stacked layer. The interlevel insulating layer and the polycrystalline silicon layer not covered by the masking pattern are etched in turn by an anisotropic etching technique. As a result, as shown in FIG. 9, elongated, parallel, space-apart portions 72 of the stacked layer consisting of polycrystalline layer 70 and interlevel insulating layer 52 extend in the first direction along side portions of field oxide layer 12.

Figure 10:
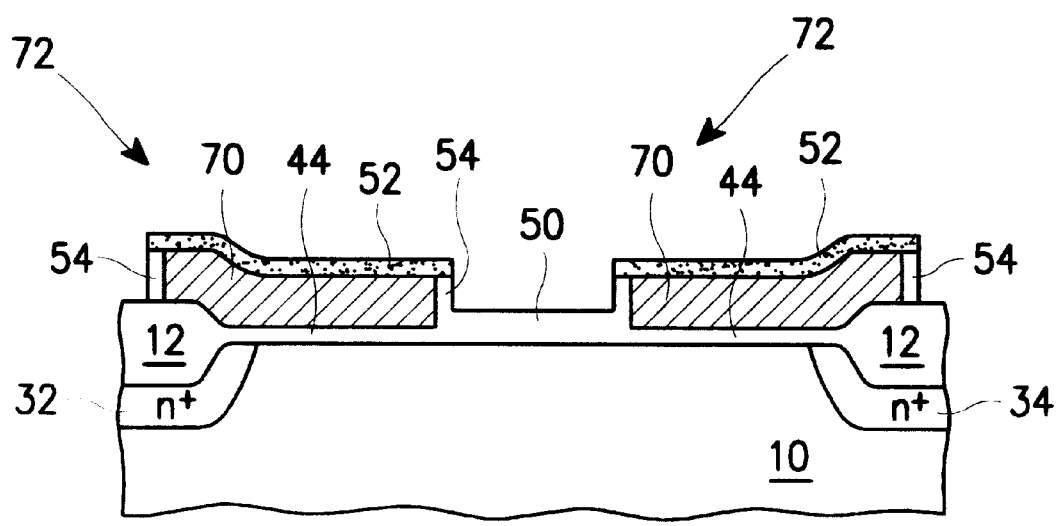
Figure 11:
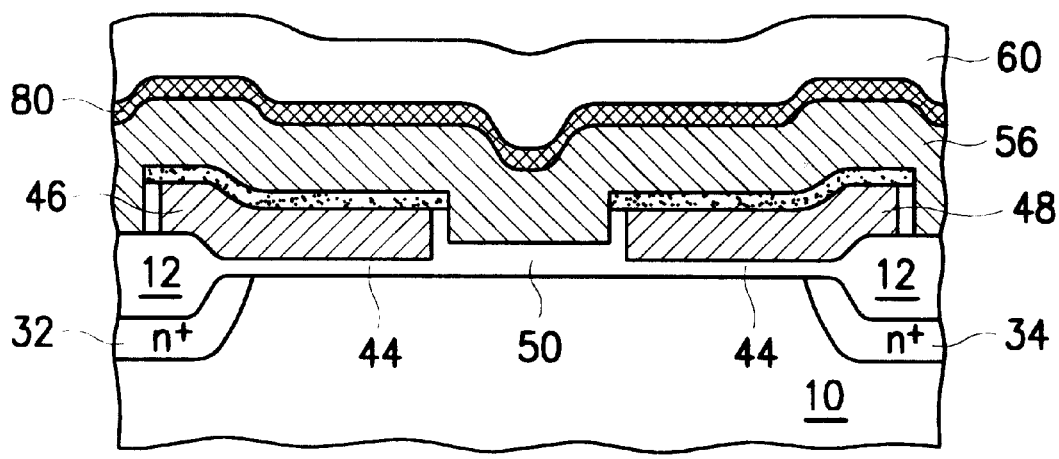

After the formation of the portions, as shown in FIG. 10, the portion of thin insulating layer 44 that is between portions 72 is removed, and a thin gate oxide layer 50 with a thickness of about 200 Å is then grown. An insulating layer added on the remaining thin insulating layer without the removal of the insulating layer 44 may also be thermally grown. During the growing of gate oxide layer 50, side-wall insulating layer 54 is formed on the side-walls around portions 72.

Thereafter, a polycide layer is deposited, consisting of a layer of polycrystalline silicon with a thickness of about 1,500 Å and a layer of refractory metal silicide, such as WSi, TiSi, MoSi, TaSi and the like, with a thickness of about 2,000 Å. Then an insulating layer 80, such as a TEOS layer or a nitride layer or a complex layer of oxide and nitride is deposited, having a thickness of about 2,000 Å. Elongated strips of masking pattern extending in the second direction are then formed on the insulating layer 80 to define word lines. Then the exposed insulating layer and the underlying polycide layer and interlevel insulating layer 52 and polycrystalline layer are anisotropically etched in turn, thus forming word lines 56, 58 and floating gate layers 46, 48. Thereafter, a blanket layer of $SiO_2$ or $Si_3N_4$ is deposited with a thickness of about 1,000 Å on the substrate and then etched back. Thus, the resulting exposed side-walls of floating gate layers 46 and 48 and control gate layers 56 and 58 of polycrystalline silicon along the second direction become insulated by side-wall insulating layers 84.

Figure 12:
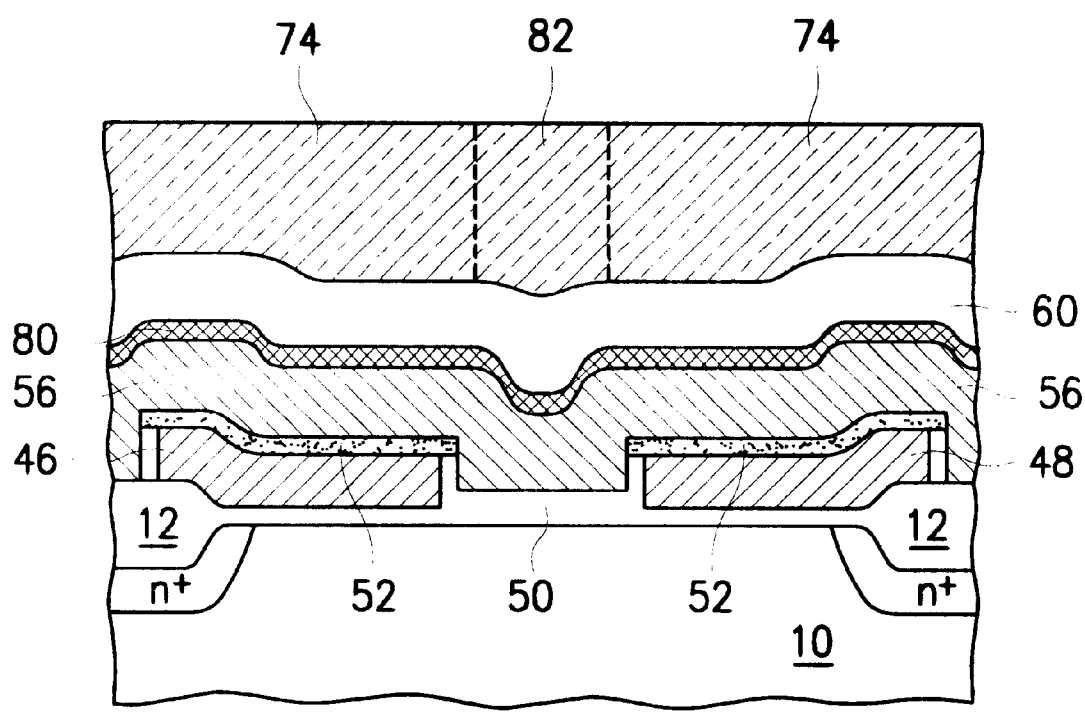

A masking layer 74 is then formed to define source regions, i.e. second diffusion regions 62, as shown in FIG. 12. As such, the masking layer has openings 82 corresponding to second diffusion regions 62. (Opening 82 in FIG. 12 is shown in dashed lines because it is not in the plane of the drawing.) The portion of gate insulating layer 50 that is not covered by the masking layer is then etched anisotropically. The exposed surface region is then subjected to arsenic ion-implantation at a dose of about $5\times10^{15}$ ions/cm$^2$ with an energy of about 60 keV. After the arsenic ion-implantation, annealing is performed, which extends second diffusion regions 62 to reach somewhat under control gate layers 56 and 58. However, the second diffusion regions must remain separated by portions of second channel regions 42 as well as of first channel regions 38 and 40. Otherwise, the selection transistor will not be formed. Thus, second diffusion regions 62 are formed between neighboring second channel regions 42, as shown in FIGS. 4 and 6. Thereafter, the masking layer is removed.

Then a side-wall insulating layer is formed on opposite side-walls of control gate layers 56 and 58 and floating gate layers 46 and 48 by an etch-back technique. Thereafter, insulating layer 60 is blanketedly deposited, and a planarization process can be performed. Thereafter, openings are formed to make contact with the second diffusion regions 62. A conductive layer is blanketedly formed by sequential deposition of polycrystalline silicon of 1,000 Å and refractory metal silicide of about 1,500 Å, or by deposition of aluminum of about 3,000 Å. After the deposition of the conductive layer, a pattern is formed to form common source line CSL 64 which is made by anisotropic etching of the exposed conductive layer, as shown in FIG. 5A.

Figure 13:
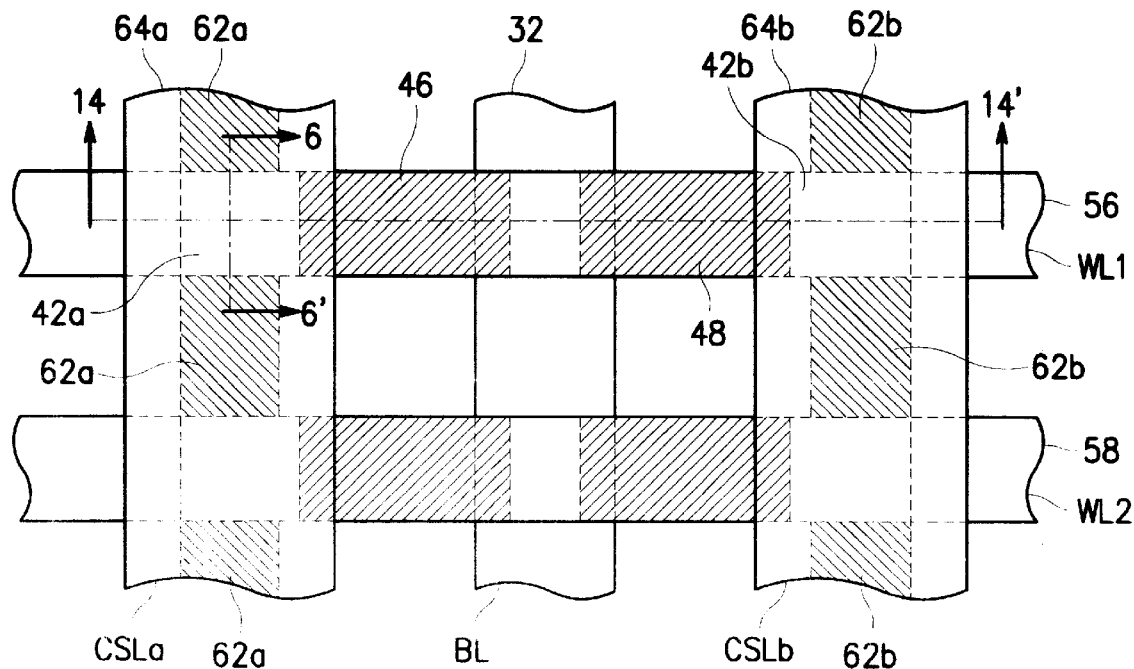
FIG. 13 illustrates an enlarged plan view of a portion of a flash EEPROM memory cell array according to another embodiment of the present invention.
Figure 14:
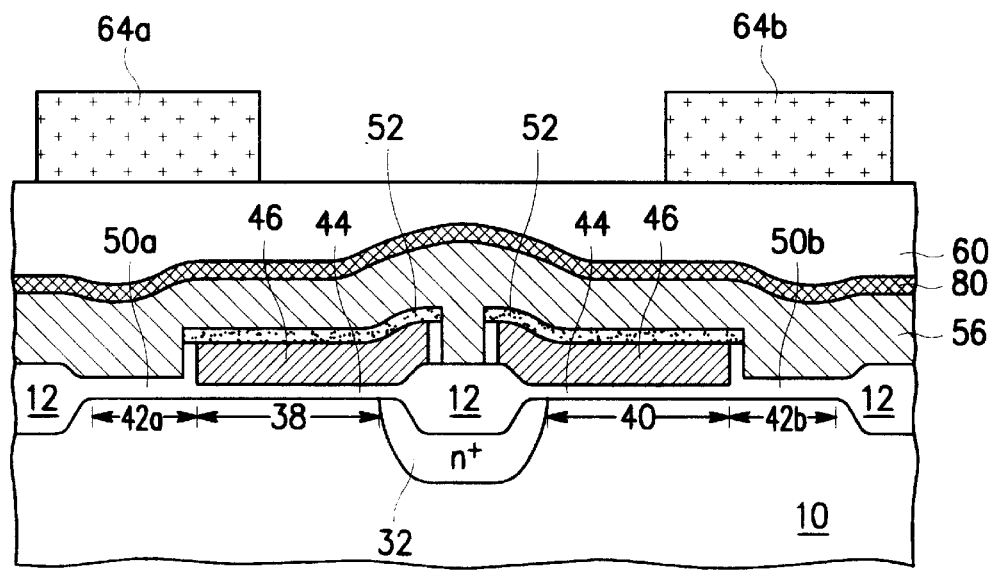
FIG. 14 illustrates a cross-sectional view taken along a line 14–14' shown in FIG. 13.

FIG. 13 shows an enlarged plan view of a portion of a flash EEPROM cell array according to another embodiment of the present invention. FIG. 14 shows an enlarged cross-sectional view taken along a line 14–14' of FIG. 13. An enlarged cross-sectional view taken along a line 6–6' of FIG. 13 is like that of FIG. 6.

FIGS. 13 and 14 show an elongated region of first diffusion disposed between common source layers 64a and 64b (whereas in FIGS. 4 and 5A, the common source layer 64 is disposed between neighboring first diffusion regions 32 and 34). The structure of FIGS. 13 and 14 is generally similar to that of FIGS. 4 and 5A except for above-mentioned difference of arrangement.

Referring to the drawings, common source layer 64a contacts with second diffusion regions 62a, i.e. source regions, extending in the first direction. In a similar manner, common source layer 64b contacts with second diffusion regions 62b extending in the first direction. Thus control gate layers 56 and 58 overlying second channel regions 42a and 42b through gate insulating layers 50a and 50b serve as gate electrodes of selection transistors. Thus, since selection transistors connected to a selected word line WL1, i.e. a selected control gate layer 56, are turned on during a read operation, electrical current flows through the bit line BL, selected memory cell, second channel region of the selection transistor connected thereto, second diffusion regions neighboring thereto, and common source line connected thereto according to the erased state of the selected memory cell. However, since 0 volts is applied to unselected word lines during the read operation, selection transistors connected to the unselected word lines are nonconductive, and thereby error data from an over-erased memory cell connected thereto will not be read out. Again, this solves the prior art problem.

Thus, even though a floating gate transistor connected to the unselected control gate layer stays in an over-erased state, a selection transistor connected in series thereto is in a nonconductive state, which prevents reading of error data during a read operation. Thus, the density of memory cells can be increased with no increase in the size of nonvolatile semiconductor memory.

What is claimed is:

1. A nonvolatile semiconductor memory device comprising:
   a semiconductor substrate of a first conductivity type having a surface region;
   a first diffusion region of a second conductivity type opposite to the first conductivity type, formed in said surface region to extend in a first direction;
   a plurality of channel regions in said surface region, separated from one another and extending from an edge of said first diffusion region in a second direction generally perpendicular to the first direction;
   a plurality of floating gate layers of conductive material, each floating gate layer formed over a first portion of a respective channel region on a first insulating layer and extending over a portion of said first diffusion region;
   a plurality of control gate layers of conductive material formed to extend over said floating gate layers and over second portions of said channel regions not covered by said floating gate layers, and separated from said floating gate layers by a second insulating layer and from said second portions by a third insulating layer; and
   a plurality of second diffusion layers of the second conductivity type, formed in said surface region between neighboring ones of said second portions of said channel regions.

2. The memory device as recited in claim 1 further comprising an elongated conductive layer formed to extend in the first direction so as to be separated from said control gate layers and to contact with said second diffusion regions.

3. The memory device as recited in claim 2 further comprising a field oxide layer disposed between said portion of said first diffusion region and said floating gate layers thereon.

4. The memory device as recited in claim 3, wherein said field oxide layer extends in the first direction on said first diffusion region.

5. The memory device as recited in claim 3, wherein said first diffusion region is a graded diffusion region.

6. The memory device as recited in claim 1, wherein said second diffusion regions extend into said second portions of said channel regions such that opposite edges of two neighboring ones of said second diffusion regions are separated from each other.

7. The memory device as recited in claim 1, wherein said control gate layers are generally aligned with said floating gate layers along said second direction.

8. The memory device as recited in claim 7 further comprising side-wall insulating layers formed on side-walls along the second direction of said control gate layers.

9. The memory device as recited in claim 8, wherein said opposite edges of two neighboring ones of said second diffusion regions are disposed under said side-wall insulating layers.

10. A nonvolatile semiconductor device comprising:
    a semiconductor substrate of a first conductivity type having a surface region;
    a pair of first diffusion regions of a second conductivity type opposite to the first conductivity type, formed in said surface region and extending in a first direction so as to be separated from and parallel to each other;
    a plurality of channel regions in said surface region, defined between said first diffusion regions in a second direction generally perpendicular to the first direction, and separated from one another, each of said channel regions having a pair of first channel regions contiguous to said pair of said first diffusion regions and a second channel region therebetween;
    pairs of floating gate layers of conductive material disposed over said first channel regions on a first insulating layer and over side portions of said first diffusion regions;
    a plurality of control gate layers of conductive material each formed to extend in the second direction on a second insulating layer overlying a respective one of said pairs of said floating gate layers and on a third insulating layer overlying said second channel region therebetween;
    a plurality of second diffusion regions of the second conductivity type, disposed in said surface region between neighboring ones of said second channel regions; and
    an elongated conductive layer disposed over said control gate layers on a fourth insulating layer and contacting said second diffusion regions.

11. The memory device as recited in claim 10, wherein opposite edges of two neighboring ones of said second diffusion regions extend into a corresponding one of said second channel regions so as to be separated from each other.

12. The memory device as recited in claim 10, wherein each of said control gate layers is aligned with a corresponding one of said pairs of said floating gate layers along said second direction.

13. The memory device as recited in claim 12 further comprising a side wall insulating layer formed on side walls of said control gate layers along said second direction.

14. The memory device as recited in claim 13, wherein opposite edges of two neighboring ones of said second diffusion regions are disposed underneath said side wall insulating layer.

15. The memory device as recited in claim 11 further comprising a field oxide layer disposed between said first diffusion regions and said floating gate layers.

16. The memory device as recited in claim 15, wherein said field oxide layer extends over one of said first diffusion regions in the first direction.

17. The memory device as recited in claim 15, wherein each of said first diffusion regions is a graded diffusion region of the second conductivity type.

* * * * *